United States Patent [19]

Sasaki

[11] B 4,009,401
[45] Feb. 22, 1977

[54] FADE-IN AND FADE-OUT SWITCHING CIRCUIT

[75] Inventor: Masanobu Sasaki, Tokyo, Japan

[73] Assignee: Sony Corporation, Tokyo, Japan

[22] Filed: Sept. 5, 1974

[21] Appl. No.: 503,371

[44] Published under the second Trial Voluntary Protest Program on March 30, 1976 as document No. B 503,371.

[30] Foreign Application Priority Data

Sept. 7, 1973 Japan ............... 48-100870

[52] U.S. Cl. ................ 307/251; 307/304; 330/35; 357/22
[51] Int. Cl.$^2$ ........................... H03K 17/60
[58] Field of Search ........... 307/251, 304; 330/35, 330/29, 145; 357/22

[56] References Cited

UNITED STATES PATENTS

| | | | |
|---|---|---|---|
| 3,560,726 | 2/1971 | Platt et al. | 307/251 X |
| 3,621,304 | 11/1971 | Houpt | 307/251 X |
| 3,654,394 | 4/1972 | Gordon | 307/251 X |
| 3,662,113 | 5/1972 | Recklinghausen | 307/251 X |
| 3,740,581 | 6/1973 | Pfiffner | 307/251 |
| 3,757,139 | 9/1973 | Hunter | 307/251 |
| 3,868,718 | 2/1975 | Arai | 307/304 X |

OTHER PUBLICATIONS

Heiering, "Feldeffekttransistoren als Koppelpunkte in der Fernsprechtechnik," Heft 10, 1970, NTZ (German), pp. 522-526.

*Primary Examiner*—Stanley D. Miller, Jr.
*Assistant Examiner*—L. N. Anagnos
*Attorney, Agent, or Firm*—Hill, Gross, Simpson, Van Santen, Steadman, Chiara & Simpson

[57] ABSTRACT

A switching circuit using first and second semiconductor devices each having a semiconductive substrate with a current path portion, first and second semiconductive regions forming a PN junction therebetween, the first region being capacitively coupled to the current path portion, a control electrode connected to the second region, a signal input terminal electrically connected to the first terminal of the first semiconductor device, an output terminal electrically connected to the second terminal of the first semiconductor device, means for connecting the control electrode of the first semiconductor device to the first terminal of the second semiconductor device, means for applying a bias voltage to the second terminal of the second semiconductor device, and switch means for selectively applying a bias voltage to the control electrode of said second semiconductor device. The switching circuit is operated with a signal applied to the control electrode of the second semiconductor device.

8 Claims, 18 Drawing Figures

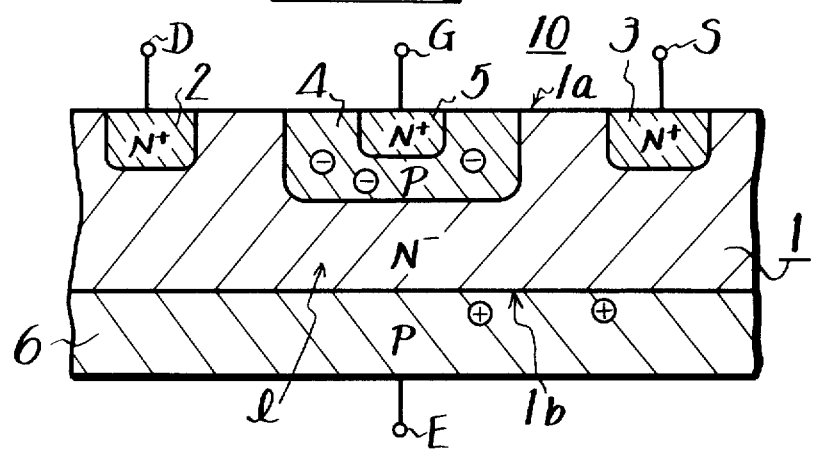
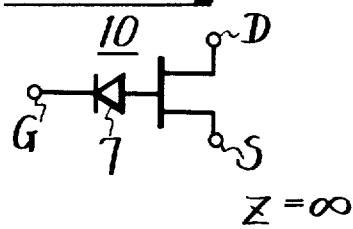 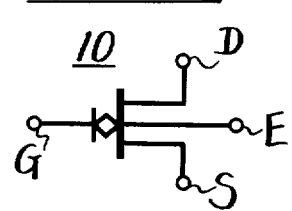
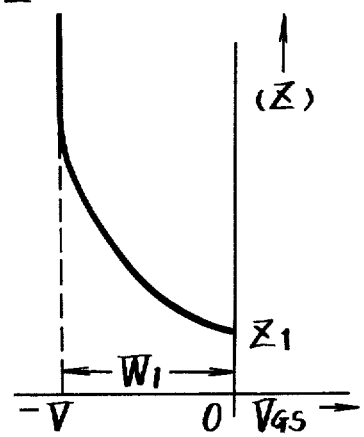
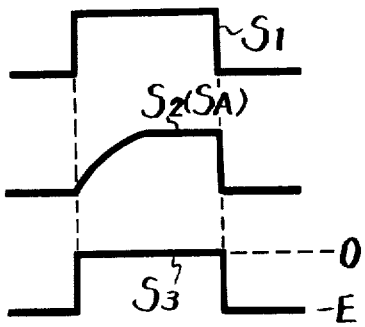

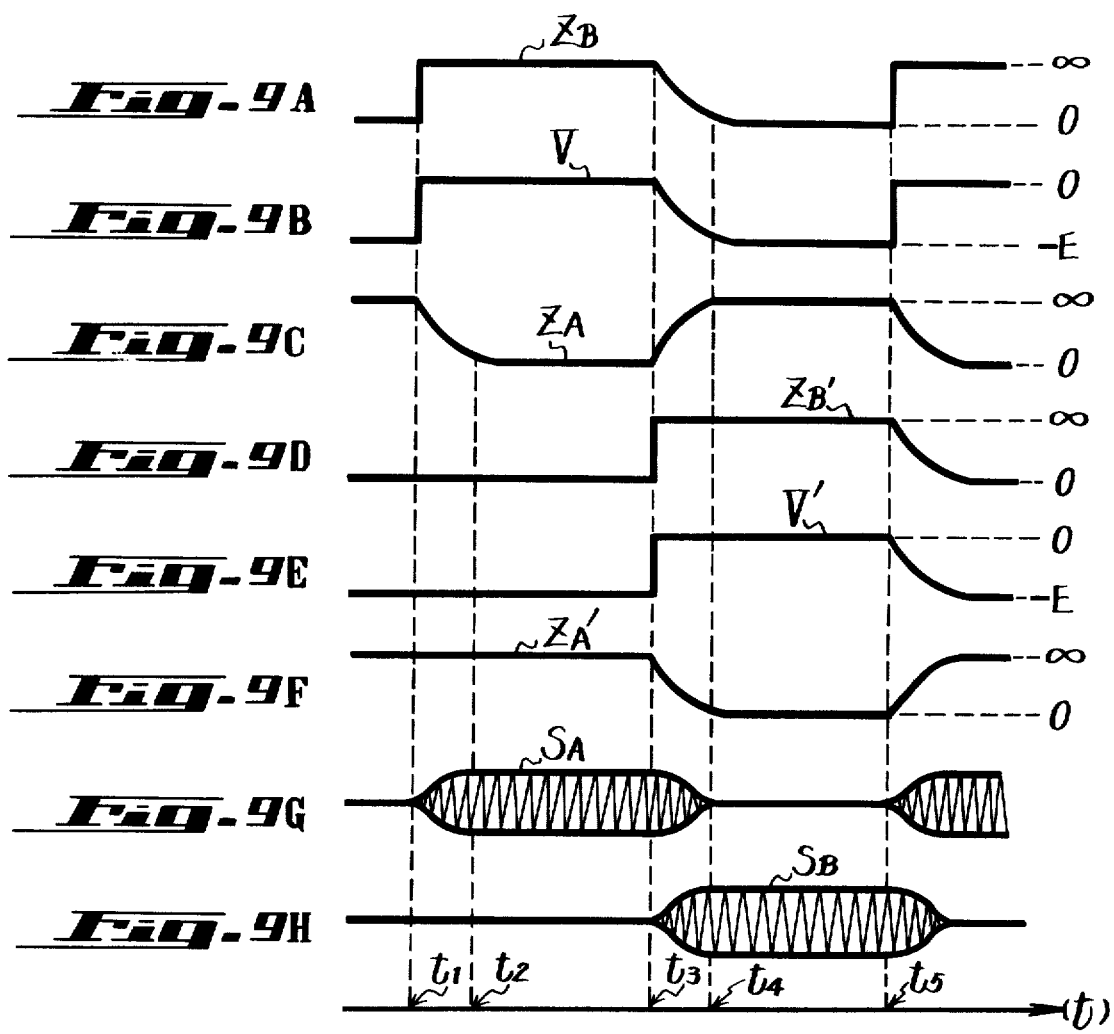

FADE-IN AND FADE-OUT SWITCHING CIRCUIT

BACKGROUND OF THE INVENTION

1. Field of the Invention

This invention generally relates to a switching circuit, and more particularly to a switching circuit using semiconductor devices for fade-in and fade-out operations.

2. Description of the Prior Art

Generally, a fade-in or fade-out operation is utilized as a special effect in a radio or a television. The fade-in or fade-out operation can be performed in such a manner that a signal gain is manually and gradually varied or that a circuit is used by which the signal gain is automatically varied for a given time. However, the manual control is inconvenient for consumers. And in the automatic control, the arrangement of the circuit is complicated and a fade-in time interval or a fade-out time interval cannot be varied. Accordingly, the automatic control is inconvenient and not practical.

SUMMARY OF THE INVENTION

An object of this invention is to provide a switching circuit which is simple in construction and whose fade-in time and/or fade-out time interval can be freely varied.

Another object of this invention is to provide a switching circuit in which no click occurs on the switching operation.

A further object of this invention is to provide a switching circuit using a pair of novel semiconductor devices.

In accordance with an aspect of this invention, there is provided a switching circuit which comprises first and second semiconductor devices each including a semiconductive substrate having a current path portion, first and second semiconductive regions forming a PN junction therebetween, the first region being capacitively coupled to the current path portion, a control electrode connected to the second region, first and second terminals electrically connected to both ends of the current path portion respectively, a signal input terminal electrically connected to the first terminal of the first semiconductor device, an output terminal electrically connected to the second terminal of the first semiconductor device, means for connecting the control electrode of the first semiconductor device to the first terminal of the second semiconductor device, means for applying a bias voltage to the second terminal of the second semiconductor device, and switch means for selectively applying a bias voltage to the control electrode of the second semiconductor device.

The above, and other objects, features and advantages of this invention will be apparent in the following detailed description of illustrative embodiments thereof which is to be read in connection with the accompanying drawings.

BRIEF DESCRIPTION OF THE DRAWINGS

FIG. 1 is a cross-sectional view of an embodiment of semiconductor devices which can be used in this invention with desired effects;

FIG. 2 is an equivalent circuit diagram which symbolizes the semiconductor device shown in FIG. 1;

FIG. 3 is a symbol for representing the semiconductor device shown in FIG. 1;

FIGS. 4 and 5 are graphs for showing the impedance changes of the semiconductor device;

FIGS. 6A, 6B and 6C are waveform diagrams used for explaining the operation of the semiconductor device;

FIGS. 9A to 9H, inclusive, are waveform diagrams used for explaining the operations of the embodiments shown in FIGS. 7 and 8.

DESCRIPTION OF THE PREFERRED EMBODIMENTS

Figure 5:
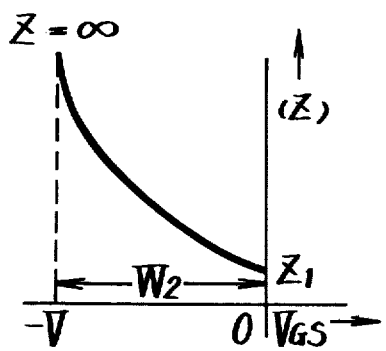

This invention will be hereinbelow described with reference to the drawings.

To begin with, a semiconductor device which may be used in the invention with excellent results will be now described. The semiconductor device has such a signal transmission characteristic that when an input signal is applied thereto, its rising up characteristic is made gradual. If such a semiconductor device is employed in a switching circuit, due to its signal transmission characteristic, a so-called fade-in operation is achieved for an input signal and a spike noise which may be produced when a well known field effect transistor (FET) is employed can be eliminated.

In such a semiconductor device with the signal transmission characteristic mentioned as above, a semiconductor region which is capacitively coupled to a main current path portion is supplied with a control signal through a PN-junction. Such a device may be called a charge storage junction type field effect transistor for the reason mentioned as follows. In order to distinguish it from a prior art FET, it will be hereinafter referred to as a "CSJ FET".

FIG. 1 shows an embodiment of a CSJ FET applied to a conventional junction type FET. In FIG. 1, reference numeral 10 indicates the CSJ FET generally (in the other figures, reference numeral 10 generally indicates the CSJ FET, similarly), and 1 indicates an N-type semiconductor substrate. An N$^+$-type impurity is diffused to the semiconductor substrate 1 from its major surface 1a at predetermined positions to form drain and source regions 2 and 3, respectively. A P-type impurity is diffused into the semiconductor substrate 1 from the major surface 1a at a position corresponding to a main current path portion $l$ in the semiconductor substrate 1 and between the region 2 and 3 to form a P-type semiconductor region 4, which is capacitively coupled to the main current path portion $l$. In the case of a junction type FET the P-type region 4 is used as a gate region, but in the case of the CSJ FET 10 an N$^+$-type impurity is further diffused into the P-type region 4 to form an N$^+$-type region 5 in the P-type region 4 and hence to form a PN-junction therebetween. A drain electrode D, a source electrode S and a gate electrode G are led out from the regions 2, 3 and 5, respectively. On another major surface 1b (the lower surface in FIG. 1) of the semiconductor substrate 1a P-type semiconductor layer 6 is formed from which an emitter electrode E is led out. Thus, the CSJ FET 10 is constructed.

Since the PN-junction is formed in the gate region by the regions 4 and 5 in the CSJ FET 10, it also can be said that a diode 7 is provided in the gate electrode G as shown in FIG. 2. However, in this invention, the CSJ FET 10 is symbolized as shown in FIG. 3 instead of that shown in FIG. 2.

The change of an impedance Z between the source and drain of the ordinary junction type FET relative to a control signal or voltage V (gate voltage $V_{GS}$) is shown in FIG. 4. That is, the impedance Z becomes infinite for a control voltage $-V$ by which the ordinary junction type FET is made cut off, but when the control voltage V is varied from $-V$ to 0, the impedance Z arrives at a predetermined value $Z_1$ and consequently the ordinary junction type FET becomes conductive. In this case, if a time interval in which the impedance Z is changed from infinite as to $Z_1$ is taken as $W_1$, this time interval $W_1$ is generally very short when the above impedance change is performed. As a result, if an input signal is in the form of, for example, a rectangle, an output signal is also in the form of rectangle.

However, since in the CSJ FET 10 shown in FIG. 1 the PN-junction is formed in the gate electrode G, the CSJ FET 10 is different from the conventional junction type FET in operation. In detail, when the control voltage $-V$ is applied to the CSJ FET 10 to make the same cut off, the PN-junction in the gate electrode G thereof is biased forwardly, and hence the CSJ FET 10 is made in the state with no PN-junction in its gate electrode G. However, if it is taken in account that the gate electrode G is made in the state with no bias, the PN-junction is tended to be in the reverse bias direction with the result that the P-type region 4 may store negative charges − and a capacitor may be formed in the gate region apparently. During the time interval when the negative charge − is stored in the P-type region 4, the PN-junction formed between the semiconductor substrate 1 and the P-type region 4 is not biased forwardly if leakage is neglected. Accordingly, a depletion layer formed in the main current path portion 1 is not shrunk immediately. However, if positive charges or holes + are injected thereinto from the outside the negative charges − are neutralized thereby with the result that the PN-junction is biased forwardly and hence the depletion layer is shrunk. The positive hole + can be injected by, for example, such a manner that a voltage is applied across the emitter and source electrodes E and S to bias the portion therebetween forwardly. It may be also possible that the above neutralization is carried out by the irradiation of light thereto. However, in the following description, the neutralization is performed by the application of voltage, by way of example. The time interval for finishing the neutralization depends upon the magnitude of the voltage or the time interval becomes short as the applied voltage is high. In the case where light is used, it will be, of course, obvious that if the amount of light is great, the neutralization interval of time becomes short.

The relationship between the neutralization interval of time and the impedance Z across the source and drain electrodes of the CSJ FET 10 is shown in FIG. 5. That is, the neutralization interval of time is substantially the same as a time interval $W_2$ within which the impedance Z is decreased to a predetermined value from an infinite impedance as the CSJ FET 10 is switched to a normal state (ON-state), the impedance Z thereof is changed as shown in FIG. 5. As a result, when an input signal $S_1$ shown in FIG. 6A, by way of example, is applied to the CSJ FET 10, it produces an output signal $S_2$ shown in FIG. 6B which rises up gradually and whose rising up time constant can be controlled by the neutralization interval of time $W_2$. The falling down of the output signal $S_2$ is abrupt because no charge storage is carried out. FIG. 6C shows a control signal (voltage) $S_3$ which may make the CSJ FET 10 ON and OFF.

A switching circuit according to this invention utilizes the CSJ FET 10 with the characteristic mentioned as above and performs so-called fade-in and fade-out operations.

Figure 7:
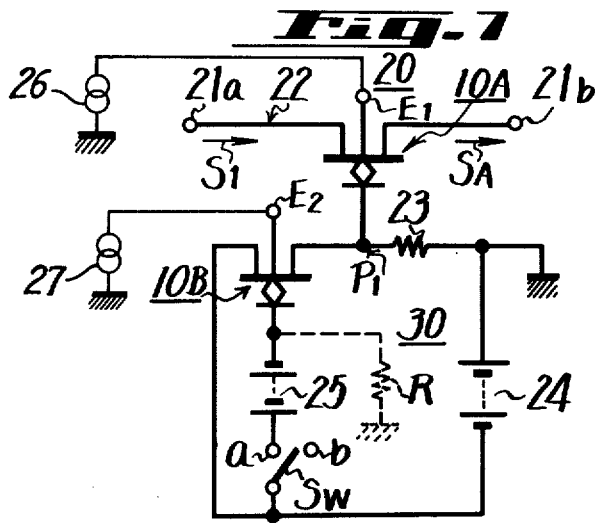
FIG. 7 is a connection diagram for showing an embodiment of the switching circuit according to this invention.

FIG. 7 shows an embodiment of the switching circuit 20 according to this invention in which first and second CSJ FETs 10A and 10B similar to that shown in FIG. 1 or FIG. 3 are used. The first CSJ FET 10A is inserted in series into a signal transmission path 22 between input and output terminals 21a and 21b. The gate electrode of the CSJ FET 10A is grounded through a resistor 23. Emitter electrodes $E_1$ and $E_2$ of the CSJ FETs 10A and 10B are connected with a current source circuit 26 and 27 to be supplied with a desired current. In order to control a control voltage applied to the gate electrode of the CSJ FET 10A at the falling down time of the input signal $S_1$, the following circuit is provided. The second CSJ FET 10B is connected in series between the gate electrode of the first CSJ FET 10A and the negative electrode of a DC power source 24, and another DC power source 25 and a control switch SW are connected in series to the gate electrode of the second CSJ FET 10B to form a control circuit 30 for the control voltage. The positive electrode of the DC voltage source 24 is grounded. The emitter voltages at the emitter electrodes $E_1$ and $E_2$ are selected equal, but can be changed if desired.

The operation of the switching circuit 20 will be now described with reference to FIGS. 9A to 9H in which a time $t_1$ represents the time at which the movable contact of the switch SW is switched to be in contact with its one fixed contact $a$ and a time $t_3$ represents the time at which the movable contact is switched to be in contact with its other fixed contact $b$. If it is assumed that the input signal $S_1$ is always applied to the input terminal 21a and the switch SW is changed such that its movable contact is in contact with the fixed contact $a$, the gate electrode of the second CSJ FET 10B is supplied with a negative voltage. Thus, the impedance between the source and drain electrodes of the second CSJ FET 10B becomes infinite, and accordingly the CSJ FET 10B becomes OFF. Therefore, the control voltage $V_{GS}$ applied to a point $P_1$ becomes substantially zero and hence the first CSJ FET 10A is made ON. As a result, the input signal $S_1$ is transmitted to the output terminal 21b. However, since the rising up characteristic of the first CSJ FET 10A is slow or gradual as described previously, the output signal $S_A$ increases gradually in level and arrives to a stationary level at a time $t_2$ (time constant is $t_2 - t_1$). That is, the fade-in operation is performed.

FIG. 9A is a waveform which shows the change of an impedance $Z_B$ of the second CSJ FET 10B, FIG. 9B is a waveform of a control voltage V at the point $P_1$ and FIG. 9C is a waveform of an impedance $Z_A$ of the first CSJ FET 10A, respectively.

If the switch SW is changed to make its movable contact in contact with the other fixed contact $b$, the second CSJ FET 10B is made ON and the control voltage V applied to the point $P_1$ arrives at a predetermined negative voltage. Accordingly, the first CSJ FET 10A is made OFF and consequently the output signal $S_A$ becomes substantially zero. At the same time that the switch SW is switched, the gate voltage of the second CSJ FET 10B is changed from negative to zero. However, the impedance $Z_B$ of the second CSJ FET 10B is not changed abruptly but gradually from the time $t_3$ to a time $t_4$ as shown in FIG. 9A and hence the control voltage V at the point $P_1$ also is changed gradually and slowly attains the predetermined voltage -E, as shown in FIG. 9B. In other words, the control voltage V is controlled by the second CSJ FET 10B, so that the impedance $Z_A$ of the first CSJ FET 10A is controlled to increase gradually as shown in FIG. 9C and consequently the falling down portion of the output signal $S_A$ becomes gradual (refer to FIG. 9G). Thus, the fade-out operation is carried out.

In the embodiment of FIG. 7, the gate electrode of the first CSJ FET 10A is grounded through the resistor 23, but since the resistor 23 acts to positively ground the gate electrode of the first CSJ FET 10A when the second CSJ FET 10B becomes OFF, the resistor 23 can be omitted with the same operation. On the contrary, as shown in FIG. 7 by dotted lines, it may be possible that the gate electrode of the second CSJ FET 10B is grounded through a resistor R.

With the switching circuit of this invention, the control voltage V to be applied to the gate electrode of the first CSJ FET 10A is controlled by the changing impedance between the source and drain electrodes of the second CSJ FET 10B to perform the fade-in and fade-out operations with a simple construction. In this case, the time constants of the fade-in and fade-out operations can be freely changed by changing the current applied to the emitter electrodes $E_1$ and $E_2$ of the CSJ FETs 10A and 10B or light irradiated thereto in intensity.

Figure 8:
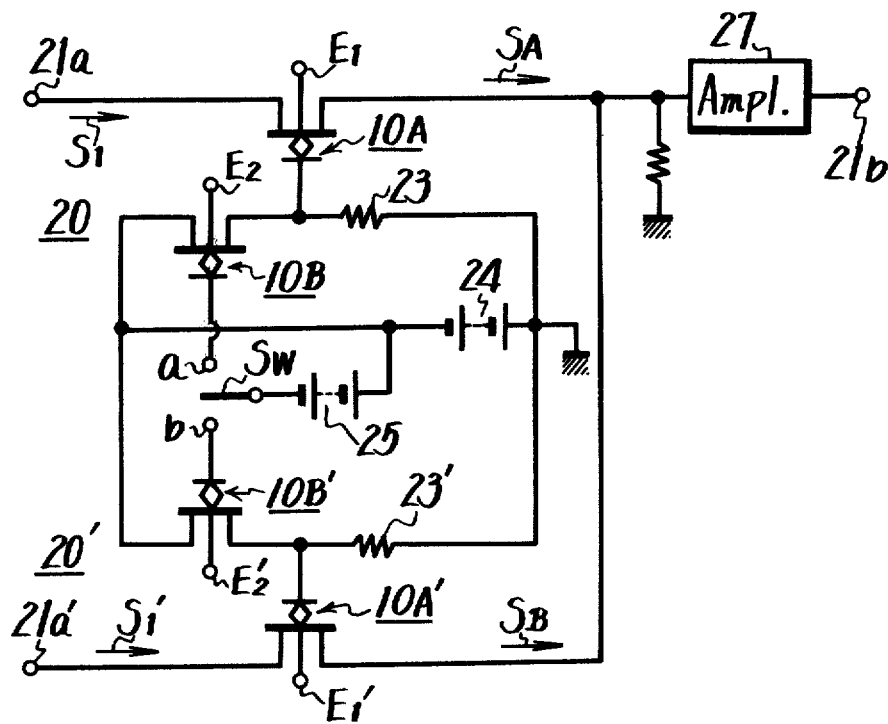
FIG. 8 is a connection diagram for showing another embodiment of this invention.

FIG. 8 shows another embodiment of this invention which is formed by connecting two of the circuits shown in FIG. 7 in parallel with each other, so that the corresponding elements of the latter are shown by the corresponding reference numerals with a dash, respectively, and their description will be omitted.

With the switching circuit of FIG. 8, if the movable contact of the switch SW is changed in contact with the fixed contact $a$ at the time $t_1$, the signal $S_A$ is delivered through an amplifier 27 to the output terminal 21$b$. In this case, the second input signal $S_1'$ applied to the input terminal 21$a'$ is taken in account. Since the second CSJ FET 10B' is ON, the first CSJ FET 10A' is biased negative at its gate electrode and hence OFF. Thus, the input signal $S_1'$ is not applied to the amplifier 27.

When the movable contact of the switch SW is changed in contact with the other fixed contact $b$ at the time $t_3$, the first input signal $S_1$ is controlled in a manner of the fade-out but the second input signal $S_1'$ is controlled in a manner of the fade-in. As a result, the two different signals $S_1$ and $S_1'$ are switched and at the same time the fade-in and fade-out operations are carried out.

FIGS. 9D to 9F and FIG. 9H show the waveforms used for carrying out the fade-in and fade-out operations of the second input signal $S_1'$ in which the corresponding waveforms are shown by the corresponding reference letters with a dash, respectively.

As described above, with this invention the signal transmission characteristic of the CSJ FET 10 is effectively utilized, and the fade-in and fade-out operations are performed for the input signal with a simple circuit construction. In other words, the impedance (channel resistance) between the source and drain electrodes of the second CSJ FET 10B is controlled to indirectly change the control voltage for the first CSJ FET 10A inserted into the signal transmission path portion 22 and to carry out the fade-out operation of the input signal. For this reason, when the two input signals $S_1$ and $S_1'$ are supplied in a changing mannner, as shown in FIG. 8, the signal change is performed gradually and the switching noise caused by the switch SW is not transmitted to the output terminal 21$b$ due to the fade-in operation.

With this invention, since the fade-in and fade-out can be freely changed by the voltage (neutralizing voltage) applied across the emitter and source electrodes of the CSJ FET, a selective effect is additionally obtained when the switching circuit shown in FIG. 8 is used.

In the above embodiments, the CSJ FET 10 is applied for the junction type FET, but a switching circuit can be formed of a CSJ FET 10, which is applied to an insulated gate type (MOS) FET as shown in U.S. patent application Ser. No. 373,731 filed on June 26, 1973, by the same assignee, with the similar effect.

It will be apparent that many modifications and variations could be effected by one skilled in the art without departing from the spirits and scope of the novel concepts of this invention.

I claim as my invention:

1. A switching circuit comprising first and second semiconductor devices each including a semiconductor substrate having a current path portion, first and second semiconductor regions forming a PN-junction therebetween, said first region being capacitively coupled to said current path portion, a control electrode connected to said second region, first and second terminals electrically connected to both ends of said current path portion respectively, a signal input terminal electrically connected to said first terminal of said first semiconductor device, an output terminal electrically connected to said second terminal of said first semiconductor device, means for connecting said control electrode of said first semiconductor device to said first terminal of said second semiconductor device, means for applying a bias voltage to said second terminal of said second semiconductor device, switch means for selectively applying a bias voltage to said control electrode of said second semiconductor device and neutralization means operative on at least one of said first and second semiconductor devices for injecting carriers into said first region of said device to independently control a fade-in and fade-out time.

2. A switching circuit as claimed in claim 1, in which a PN-junction is formed between said first region and said semiconductor substrate.

3. A switching circuit as claimed in claim 1, in which said neutralization means comprises a third semiconductor region formed in said semiconductor substrate and means provided for supplying electric current to said third semiconductor region.

4. A switching circuit as claimed in claim 1, in which the control electrode of said first semiconductor substrate is grounded through a resistor.

5. A switching circuit adapted for providing independently selectable fade-in and fade-out time intervals, comprising:
    a. first and second semiconductor devices each having a main current path portion, first and second semiconductor regions forming a PN-junction therebetween, said first region being interfaced with said current path portion, a gate electrode connected to said second region, first and second electrodes connected to both ends of said current path portion, respectively, a signal input terminal electrically connected to said first device first electrode, an output terminal connected to said first device second electrode, and said second device first electrode being connected to said first device gate electrode;

b. first and second neutralization means operative on said first and second semiconductor devices for injecting carriers into said first region of each device to independently control the fade-in and fade-out time;

c. means for applying a bias voltage to said second device second electrode; and d. control means for switchably applying a bias voltage to said second device gate electrode.

6. The switching circuit of claim 5 in which said neutralization means operative on said first and second semiconductor devices comprises a third semiconductor region also interfaced with said main current portion of said first and second semiconductor devices and having an electrode attached thereto, said electrode being connected to a current supply means for injecting carriers into said first region in relation to the magnitude of current supplied by said current supply means.

7. The switching circuit of claim 5 in which said neutralization means comprises light irradiated on each of said first and second semiconductor devices to inject carriers into said first region in relation to the intensity of said irradiated light.

8. The switching circuit of claim 5 to which is connected a substantially identical second switching circuit, a control means of said second switching circuit having a switch portion in common with a switch portion of said control means of the other switching circuit.

* * * * *